US010665976B2

(12) United States Patent
Hoyack et al.

(10) Patent No.: US 10,665,976 B2
(45) Date of Patent: *May 26, 2020

(54) FLOAT CONNECTOR FOR INTERCONNECTING PRINTED CIRCUIT BOARDS

(71) Applicant: Amphenol Corporation, Wallingford, CT (US)

(72) Inventors: Michael A. Hoyack, Sandy Hook, CT (US); Joachim I. Grek, Katrineholm (SE); Owen R. Barthelmes, Putnam Valley, NY (US)

(73) Assignee: Amphenol Corporation, Wallingford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/509,884

(22) Filed: Jul. 12, 2019

(65) Prior Publication Data

US 2019/0334269 A1    Oct. 31, 2019

Related U.S. Application Data

(63) Continuation of application No. 15/951,059, filed on Apr. 11, 2018.

(Continued)

(51) Int. Cl.
*H01R 12/81* (2011.01)
*H01R 12/91* (2011.01)
*H01R 12/73* (2011.01)
*H05K 1/11* (2006.01)
*H01R 12/70* (2011.01)
*H01R 12/71* (2011.01)
*H01R 13/24* (2006.01)

(52) U.S. Cl.
CPC ......... *H01R 12/91* (2013.01); *H01R 12/7082* (2013.01); *H01R 12/73* (2013.01); *H05K 1/111* (2013.01); *H01R 12/714* (2013.01); *H01R 13/2421* (2013.01); *H05K 2201/10189* (2013.01)

(58) Field of Classification Search
CPC ............................ H01R 12/73; H01R 12/91
USPC .................... 439/74, 75, 246, 252
See application file for complete search history.

(56) References Cited

U.S. PATENT DOCUMENTS 3,083,351 A * 3/1963 Nielsen, Jr. ........... H01R 13/111
                                                          439/851
4,514,784 A    4/1985 Williams
(Continued)

FOREIGN PATENT DOCUMENTS

EP         2445 060 A1    4/2012
TW         M539713 U      4/2017
WO    WO 2017/019763 A1   2/2017

*Primary Examiner* — Neil Abrams
(74) *Attorney, Agent, or Firm* — Blank Rome LLP

(57) ABSTRACT

A float connector for interconnecting printed circuit boards that has a contact assembly that includes one or more contacts and a holder therefor such that opposite ends of the contact are exposed outside of the holder. The holder supports each contact in a clearance fit inside thereof, thereby allowing each contact to radially tilt. One or more guide members has a one or more guide features corresponding to the ends of the contacts, respectively, for aligning the contact ends for electrical connection with a board. The contact assembly is axially moveable with respect to the one or more guide member.

15 Claims, 13 Drawing Sheets

Related U.S. Application Data

(60) Provisional application No. 62/485,628, filed on Apr. 14, 2017.

(56) References Cited

U.S. PATENT DOCUMENTS

| | | | | |
|---|---|---|---|---|
| 4,865,558 A | * | 9/1989 | Stoner | H01R 13/6315 439/246 |
| 4,939,624 A | * | 7/1990 | August | H01R 12/523 361/714 |
| 4,961,709 A | | 10/1990 | Noschese | |
| 5,137,462 A | | 8/1992 | Casey | |
| 5,178,549 A | | 1/1993 | Neumann | |
| 5,567,167 A | * | 10/1996 | Hayashi | H01R 12/523 439/75 |
| 6,315,591 B2 | * | 11/2001 | Oda | H01R 13/18 439/246 |
| 6,497,579 B1 | | 12/2002 | Garbini | |
| 6,695,622 B2 | | 2/2004 | Korsunsky | |
| 6,749,441 B1 | | 6/2004 | Ma | |
| 6,773,285 B2 | | 8/2004 | Bernat | |
| 7,108,567 B1 | | 9/2006 | Korsunsky et al. | |
| 7,210,941 B2 | * | 5/2007 | Rosenberge | H01R 13/2464 439/63 |
| 7,740,488 B2 | | 6/2010 | Taylor | |
| 8,360,789 B2 | * | 1/2013 | Yin | H01R 12/52 439/66 |
| 8,485,831 B2 | | 7/2013 | Cipolla | |
| 8,597,050 B2 | | 12/2013 | Flaherty | |
| 8,721,350 B2 | | 5/2014 | Liu | |
| 8,734,167 B2 | | 5/2014 | Aimoto | |
| 8,979,562 B2 | | 3/2015 | Crighton | |
| 9,039,433 B2 | | 5/2015 | Barthelmes | |
| 9,160,121 B2 | * | 10/2015 | Wagner | H01R 13/6315 |
| 9,281,641 B2 | * | 3/2016 | Baechle | H01R 12/716 |
| 9,484,688 B2 | * | 11/2016 | Hugel | H01R 24/542 |
| 9,502,836 B2 | | 11/2016 | Hashiguchi | |
| 10,044,120 B2 | | 8/2018 | Wang | |
| 10,505,303 B2 | * | 12/2019 | Hoyack | H01R 12/91 |
| 2009/0186495 A1 | | 7/2009 | Taylor | |
| 2014/0087592 A1 | | 3/2014 | Endo et al. | |
| 2016/0064839 A1 | | 3/2016 | Goodman | |
| 2018/0151967 A1 | | 5/2018 | Chen et al. | |
| 2018/0342822 A1 | * | 11/2018 | Minich | H01R 12/737 |

\* cited by examiner

FLOAT CONNECTOR FOR INTERCONNECTING PRINTED CIRCUIT BOARDS

RELATED APPLICATION

This is a continuation of application Ser. No. 15/951,059, filed on Apr. 11, 2018, which claims priority to U.S. provisional Application No. 62/485,628, filed Apr. 14, 2017, the entire disclosures of which are incorporated herein by reference.

FIELD OF THE INVENTION

The present invention relates to a connector for interconnecting two printed circuit boards that is low profile while also providing both axial and radial float between the printed circuit boards.

BACKGROUND OF THE INVENTION

Most board-to-board RF solutions feature a bullet with a signal contact surrounded by a full coaxial ground. For low profile solutions, e.g. below ~8 mm, the conventional full coaxial bullet is limiting for total achievable misalignment between the printed circuit boards (i.e. float).

Therefore, a need exists for a board-to-board connector that has sufficient float, particularly in low profile applications, to compensate for any misaligned between the circuit boards.

SUMMARY OF THE INVENTION

The present invention may provide a float connector a float connector for interconnecting first and second printed circuit boards that comprises a contact assembly including a plurality of contacts and a holder configured to axially support the contacts such that opposite first and second ends of each contact are exposed outside of the holder, and the holder supporting each contact in a clearance fit inside thereof, thereby allowing each contact to radially tilt with respect to the holder to compensate for radial misalignment between the first and second printed circuit boards. A first guide member that is separable from the contact assembly and supported by the first printed circuit board, the first guide member having a plurality of first guide features corresponding to each of the first ends of the contacts, respectively, the first guide features being configured to aligned the first ends of the contacts for electrical connection with the first printed circuit board. A second guide member that is separable from the contact assembly and supported by the second printed circuit board, the second guide member having a plurality of second guide features corresponding to each of the second ends of the contacts, respectively, the second guide features being configured to aligned the second ends of the contacts for electrical connection with the second printed circuit board. The contact assembly and each of the first and second guide members may be axially movable with respect to one another along an axis generally parallel to longitudinal axes of the contacts to compensate for axial misalignment between the first and second printed circuit boards.

In certain embodiments, each of the first and second guide members includes a plate and each of the first guide features and the second guide features are openings in the plate; each opening has a lead-in geometry for aligning one of the first and second ends of the plurality of contacts; a biasing member is between the holder and one of the first and second guide members; the biasing member is incorporated into one of the first and second guide members; the first and second ends of the plurality of contacts are pins that are slidably received in a respective hole of the first and second printed circuit boards, respectively, to provide the axial float and electrical connection with the first and second printed circuit boards; each of the holes includes a socket and each socket slidably receives one of the pins; and/or the plurality of contacts are electrically connected to the first and second printed circuit boards, respectively, without a solder connection thereto.

In one embodiment the first and second ends of the plurality of contacts are spring biased pins that are axially moveable to provide the axial float; and/or each of the spring biased pins connects to a respective conductive pad or trace of the first and second printed circuit boards to provide electrical connection thereto.

In some embodiments, the first and second ends of the plurality of contacts are sockets, each socket engages a pin connected to one of the first and second printed circuit boards; and/or each pin is soldered to one of the first and second printed circuit boards. In another embodiment, the holder is one or more pieces; and/or the first and second guide members are fastened to the first and second printed circuit boards, respectively.

The present invention may also provide a float connector for interconnecting first and second printed circuit boards that comprises a contact assembly including a plurality of contacts and a holder configured to axially support the contacts such that opposite first and second ends of each contact are exposed outside of the holder. A first guide member that is separable from the contact assembly and supported by the first printed circuit board, the first guide member having a plurality of first guide features corresponding to each of the first ends of the contacts, respectively, the first guide features being configured to aligned the first ends of the contacts for electrical connection with the first printed circuit board. A second guide member that is separable from the contact assembly and supported by the second printed circuit board, the second guide member having a plurality of second guide features corresponding to each of the second ends of the contacts, respectively, the second guide features being configured to aligned the second ends of the contacts for electrical connection with the second printed circuit board. The float connector having means for axial float of the contact assembly and each of the first and second guide members with respect to one another to compensate for axial misalignment between the first and second printed circuit boards and means for radial float of the contact assembly between the first and second guide members to compensate for radial misalignment between the first and second printed circuit boards.

In other embodiments, a biasing means is between the contact assembly and one of the first and second guide members; and/or the plurality of contacts are electrically connected to the first and second printed circuit boards, respectively, without a solder connection therebetween.

The present invention may yet further provide a float connector for interconnecting first and second printed circuit boards that comprises a contact assembly including a plurality of contacts and a holder configured to axially support the contacts such that opposite first and second ends of each contact are exposed outside of the holder, and the holder supporting each contact in a clearance fit inside thereof, thereby allowing each contact to radially tilt with respect to the holder to compensate for radial misalignment between the first and second printed circuit boards. A first guide member that is separable from the contact assembly and supported by the first printed circuit board, the first guide member having a plurality of first guide features corresponding to each of the first ends of the contacts, respectively, the first guide features being configured to aligned the first ends of the contacts for electrical connection with the first printed circuit board. A second guide member that is separable from the contact assembly and supported by the second printed circuit board, the second guide member having a plurality of second guide features corresponding to each of the second ends of the contacts, respectively, the second guide features being configured to aligned the second ends of the contacts for electrical connection with the second printed circuit board. The contact assembly is axially moveable between the first and second guide members along an axis generally parallel to longitudinal axes of the contacts to compensate for axial misalignment between the first and second printed circuit boards. A plurality of mating contacts are coupled with the first and second printed circuit boards, each mating contact connects with one of the plurality of contacts to provide the electrical connection with the first and second printed circuit boards.

In certain embodiments the mating contacts are one of plated holes in the first and second printed circuit boards, pins soldered to the first and second printed circuit boards, and sockets connected to the first and second printed circuit boards; the first and second ends of the plurality of contacts are pins that are slidably received in a respective hole of the first and second printed circuit boards, respectively, to provide the axial float and electrical connection with the first and second printed circuit boards; the first and second ends of the plurality of contacts are spring biased pins that are axially moveable to provide the axial float; and/or the first and second ends of the plurality of contacts are sockets, each socket engages a pin connected to one of the first and second printed circuit boards.

The present invention may yet further provide a float connector for connecting first and second printed circuit boards, comprising a contact assembly that includes multiple contacts and a dielectric holder configured to support the multiple contacts such that ends of each contact are exposed outside of the holder; and at least one plate that is separable from the contact assembly and is supported by the first printed circuit board. The plate may have a plurality of guide features corresponding to each of the contacts, respectively. The guide features may be aligned with corresponding holes in the first printed circuit board for receiving the ends of the contacts. The ends of the contacts are slidably received in the holes of the first printed circuit board, thereby providing axial float to compensate for axial misalignment between the first and second printed circuit boards, and the holder supports each contact in a clearance fit inside of the holder, thereby allowing each contact to tilt with respect to the holder to provide radial float that compensates for radial misalignment between the two printed circuit boards.

In alternative embodiments, the plate may include a spring member to force the holder away from the plate, thereby increasing the axial float; the ends of each contact may be pins; and an outer ground shield may be provided that has a plurality of conductive flexible arms in contact with the first printed circuit board.

The present invention may still further provide a float connector for connecting first and second circuit boards, comprising a contact assembly that includes multiple contacts and a dielectric holder configured to support the multiple contacts such that ends of each contact are exposed outside of the holder; at least one plate that is separable from the contact assembly and is supported by the first printed circuit board, the plate having a plurality openings aligned with holes in the first printed circuit board; and a plurality of mating contacts that are soldered to the first printed circuit board at or in the holes thereof, where each mating contact extends through one of the openings of the plate and corresponds to one of the contacts of the contact assembly. The ends of the contacts are preferably slidably coupled to the mating contacts, respectively, thereby providing axial float to compensate for axial misalignment between the first and second printed circuit boards. The holder may support each contact in a clearance fit inside of the holder, thereby allowing each contact to tilt with respect to the holder to provide radial float that compensates for radial misalignment between the two printed circuit boards.

In one embodiment, the ends of each contact of the contact assembly are sockets and each mating contact is a pin. In another embodiment the ends of each contact of the contact assembly are pins and each mating contact is a socket. In yet another embodiment, the holder is formed of one or more pieces.

In alternative embodiments, the plate may include a spring member to force the holder away from the plate, thereby increasing the axial float and an outer ground shield may be provided that has a plurality of conductive flexible arms in contact with the first printed circuit board.

The present invention may also provide a float connector for interconnecting first and second printed circuit boards that comprises a contact assembly that includes a plurality of contacts and a holder configured to axially support the contacts such that opposite first and second ends of each contact are exposed outside of the holder, and the holder supports each contact in a clearance fit inside thereof, thereby allowing each contact to radially tilt with respect to the holder to compensate for radial misalignment between the first and second printed circuit boards. A first guide member that is separable from the contact assembly and is supported by the first printed circuit board has a plurality of first guide features corresponding to each of the first ends of the contacts, respectively. The first guide features are configured to align the first ends of the contacts for electrical connection with the first printed circuit board. A second guide member that is separable from the contact assembly and is supported by the second printed circuit board has a plurality of second guide features corresponding to each of the second ends of the contacts, respectively. The second guide features are configured to align the second ends of the contacts for electrical connection with the second printed circuit board. A plurality of mating contacts are coupled with the first and second printed circuit boards. Each mating contact connects with one of the plurality of contacts to provide the electrical connection between the first and second printed circuit boards. The mating contacts may be one of plated holes in the first and second printed circuit boards, pins soldered to the first and second printed circuit boards, or sockets connected to the first and second printed circuit boards. The contact assembly and each of the first and second guide members are axially movable with respect to one another along an axis generally parallel to longitudinal axes of the contacts to compensate for axial misalignment between the first and second printed circuit boards.

In certain embodiments, the first and second ends of the plurality of contacts are pins that are slidably received in one of the mating contacts that is received in a respective hole of the first and second printed circuit boards, respectively, to provide the axial float and electrical connection with the first and second printed circuit boards; the first and second ends of the plurality of contacts are spring biased pins that are axially moveable to provide the axial float; and/or the first and second ends of the plurality of contacts are sockets, each socket engages one of the mating contacts connected to one of the first and second printed circuit boards.

The present invention may yet further provide a radial frequency float connector for interconnecting first and second printed circuit boards that comprises a contact assembly that has a plurality of contacts and a holder configured to axially support the contacts such that opposite first and second ends of each contact are exposed outside of the holder, the plurality of contacts comprising signal and ground contacts. A first guide member is separable from the contact assembly and is supported by the first printed circuit board. The first guide member has a plurality of first guide features corresponding to each of the first ends of the contacts, respectively. The first guide features are configured to align the first ends of the contacts for electrical connection with the first printed circuit board. A second guide member is separable from the contact assembly and is supported by the second printed circuit board. The second guide member has a plurality of second guide features corresponding to each of the second ends of the contacts, respectively. The second guide features are configured to align the second ends of the contacts for electrical connection with the second printed circuit board. The connector further includes means for providing axial float of the contact assembly and each of the first and second guide members with respect to one another to compensate for axial misalignment between the first and second printed circuit boards; and means for providing radial float of the contact assembly between the first and second guide members to compensate for radial misalignment between the first and second printed circuit boards.

In some embodiments, the connector further comprises means for biasing the contact assembly with respect to one of the first and second guide members; and/or the plurality of contacts are electrically connected to the first and second printed circuit boards, respectively, without a solder connection therebetween.

The present may still further provide a float connector for interconnecting printed circuit boards that comprises a contact assembly that includes at least one contact and a holder configured to axially support the at least one contact in a hole thereof such that opposite first and second pin ends of the at least one contact are exposed outside of the holder. The at least one contact has two outwardly extending ribs spaced from one another and the holder has an inner shoulder positioned between the two outwardly extending ribs. The holder supports the at least one contact in a clearance fit inside thereof, thereby allowing the at least one contact to radially tilt with respect to the holder. The at least one guide member is separable from the contact assembly and is configured to engage a printed circuit board. The at least one guide member has at least one guide feature corresponding to the first pin end of the at least one contact. The at least one guide feature is configured to align the first pin end of the at least one contact for electrical connection with the printed circuit board. The contact assembly and the at least one guide member are axially moveable with respect to one another along an axis generally parallel to a longitudinal axis of the at least one contact.

In certain embodiment, the holder is non-conductive; the holder is formed as one-piece; the at least one contact is formed as one-piece; each of the first and second ends of the at least one contact are slotted and compliant; the at least one guide member comprises a plate and the at least one guide feature is an opening in the plate, and the opening has a lead-in geometry for aligning the first pin end of the at least one contact; the first and second pin ends of the at least one contact are spring biased; and/or a biasing member is located directly between the holder and the at least one guide member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENT

Figure 1:
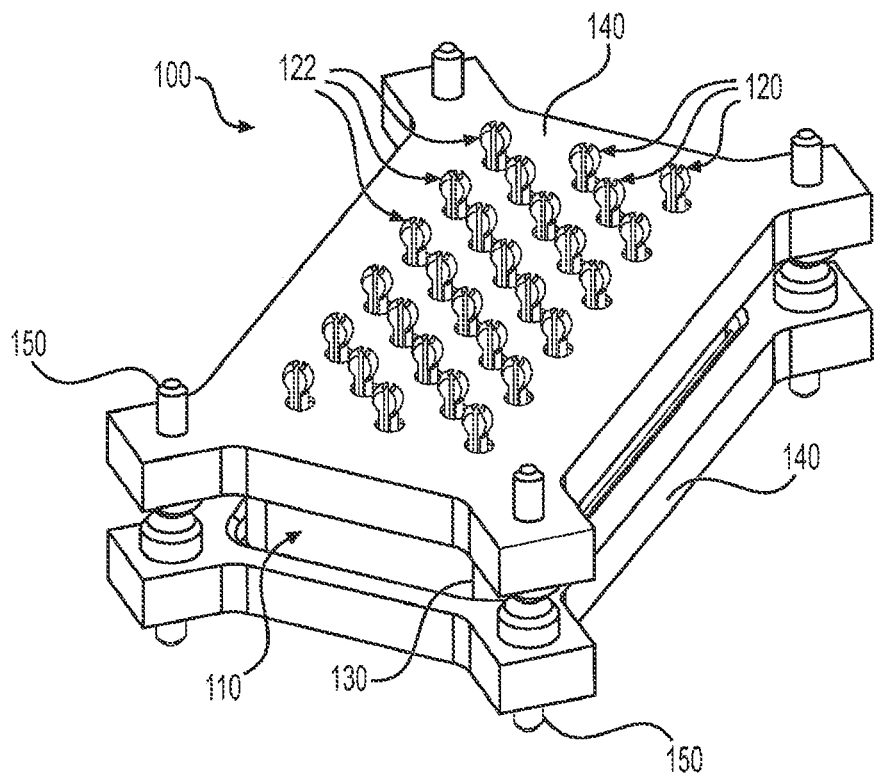
FIG. 1 is a perspective view of a float connector according to a first exemplary embodiment of the present invention

Referring to the figures, the present invention relates to a connector 100, 200, 300, and 400, such as an RF board-to-board connector, that has both high float capability and a low profile for interconnecting two printed circuit boards 10 and 12. The connector is effective in applications, such as those with small board spacing, e.g. under ~8 mm. The connector of the present invention is designed to compensate for both axial and radial misalignment between the circuit boards. The connector of the present invention is designed to achieve higher levels of float even in such low profile applications.

FIGS. 1-6 illustrate connector 100 according to a first exemplary embodiment of the present invention. The connector 100 generally includes a contact assembly 110 comprising a matrix of a plurality of contacts 120 supported by a holder 130 in such a manner as to allow radial tilt of the contacts 120, where the contact assembly 110 is axially moveable between guide members 140 associated with the circuit boards 10 and 12 to interconnect the same.

Figure 2:
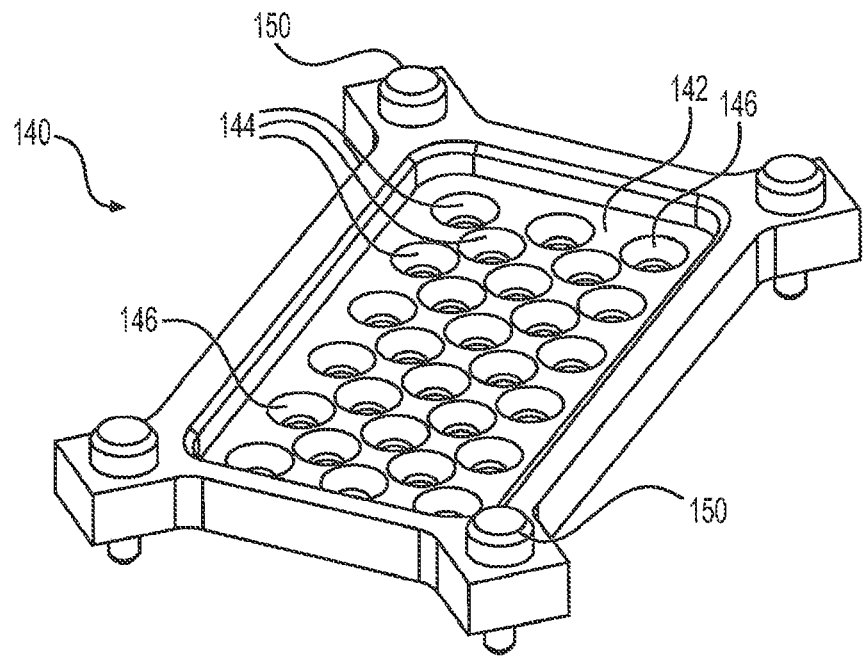
FIG. 2 is a guide member of the float connector illustrated in FIG. 1.
Figure 4:
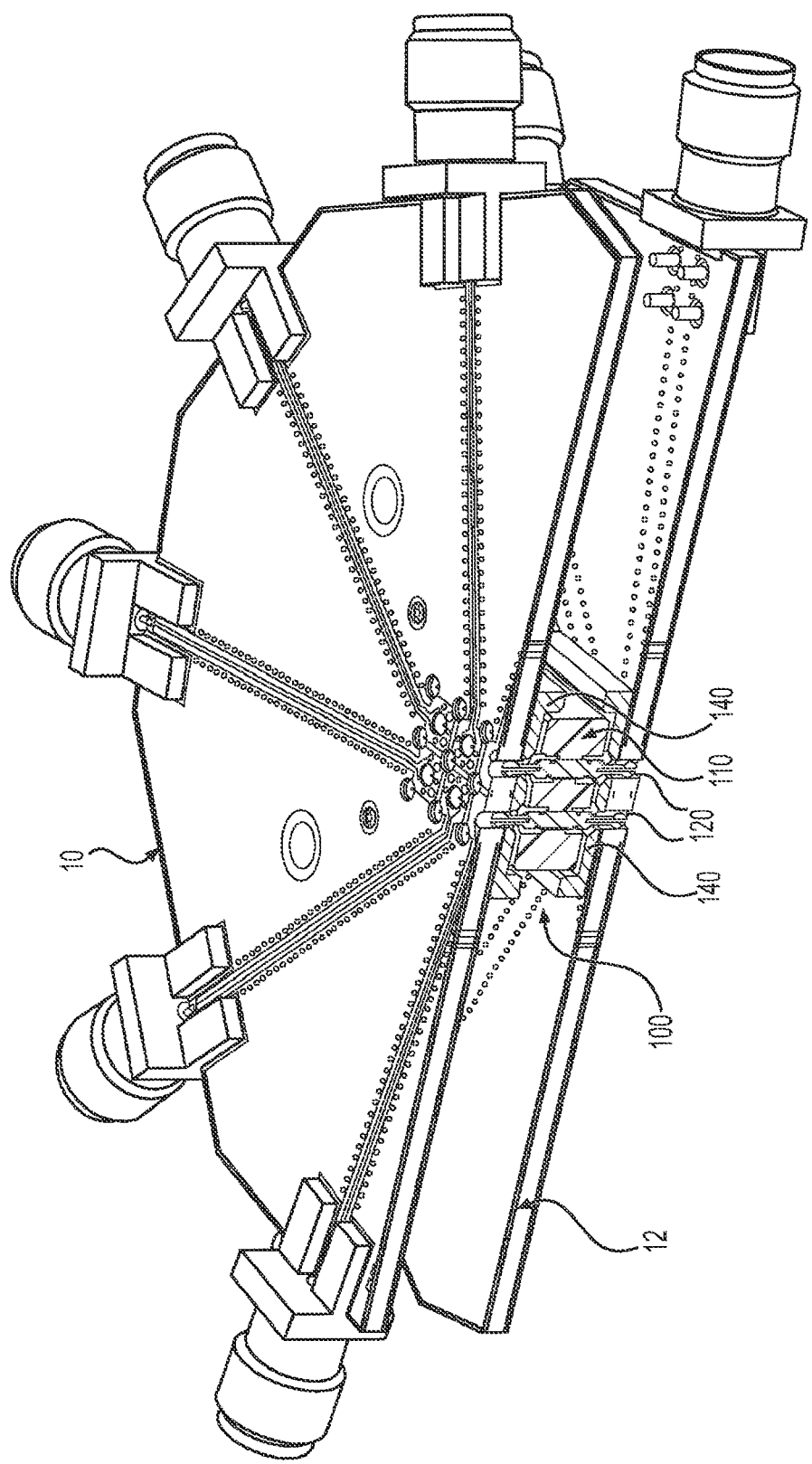
FIG. 4 is a perspective sectional view of the float connector illustrated in FIG. 1, showing the float connector interconnecting two printed circuit boards.

Each printed circuit board 10 and 12 is preferably outfitted with one of the guide members 140 (FIG. 2). Each guide member 140 is positioned over plated holes 14 of the boards, as seen in FIG. 4. The guide members 140 are designed to enable proper mating of the contacts 120 and the boards 10 and 12, such as in a blind mate situation. The plated holes 14 of each printed circuit board 10 and 12 may be larger than normal to facilitate acceptance of the contacts 120 of the contact assembly 110.

Each guide member 140 may be a plate 142 with a number of guide features, such as spaced openings 144 corresponding to the number, pattern, or arrangement of the contacts 120 supported in the holder 130. Each opening 144 may be generally funnel shaped to provide lead-in geometry 146 to ease and align insertion of the ends 122 of the contacts 120 when mating the contact assembly 110 the respective boards 10 and 12. The lead-in geometry 146 of the openings 144 guide the contacts 120 into electrical contact with the printed circuit board, that is when inserted into holes 14 thereof, even if the contacts 120 are out of direct alignment to the holes 14. One or more posts 150 may be provided at the perimeter of the guide plate 142 to secure the same to a respective circuit board 10 or 12.

Figure 3A:
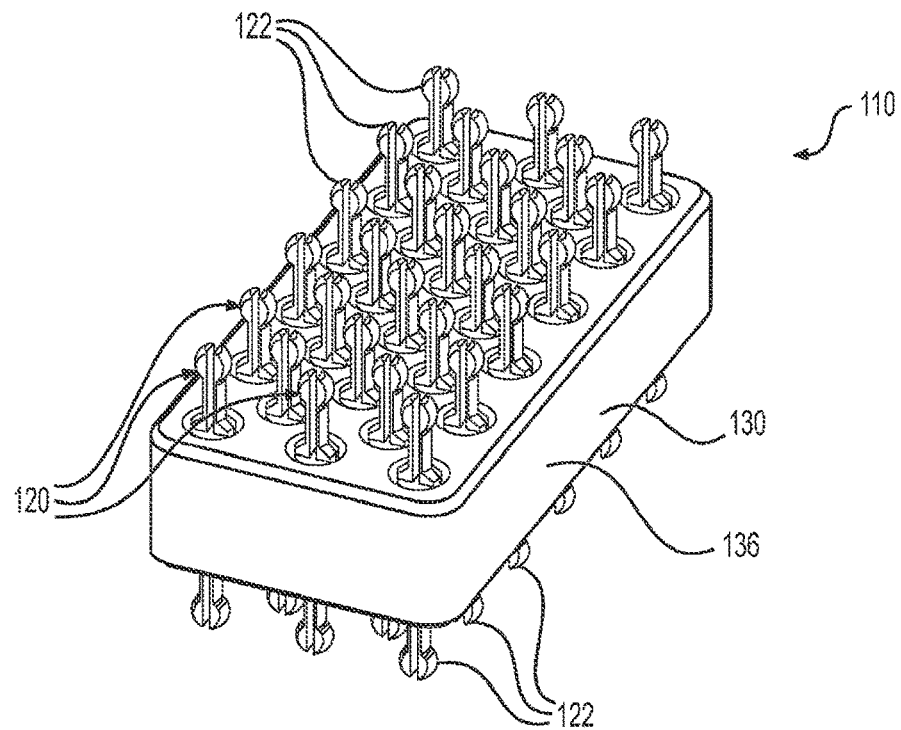
FIG. 3A is a contact assembly of the float connector illustrated in FIG. 1.
Figure 3B:
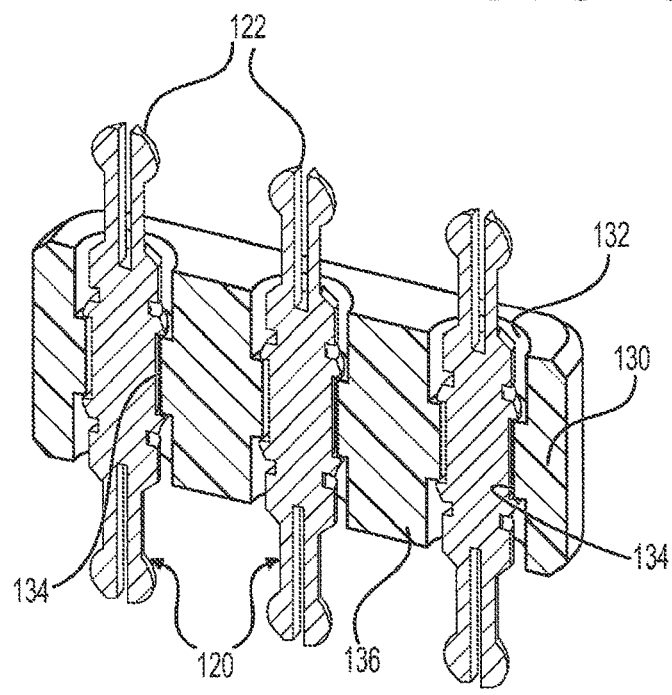
FIG. 3B is a partial cross-sectional view of the contact assembly of FIG. 3A.
Figure 3C:
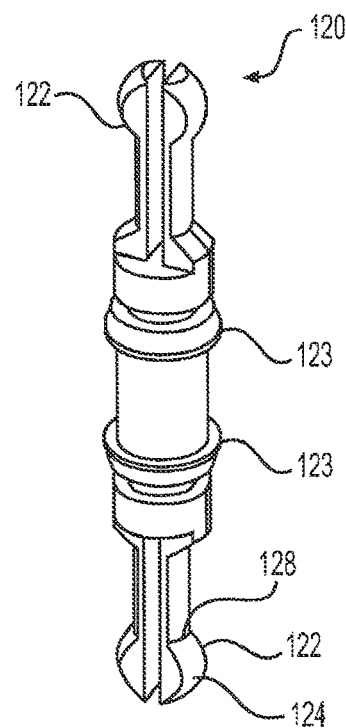
FIG. 3C is a perspective view of an exemplary contact of the contact assembly of FIG. 3A.
Figure 5:
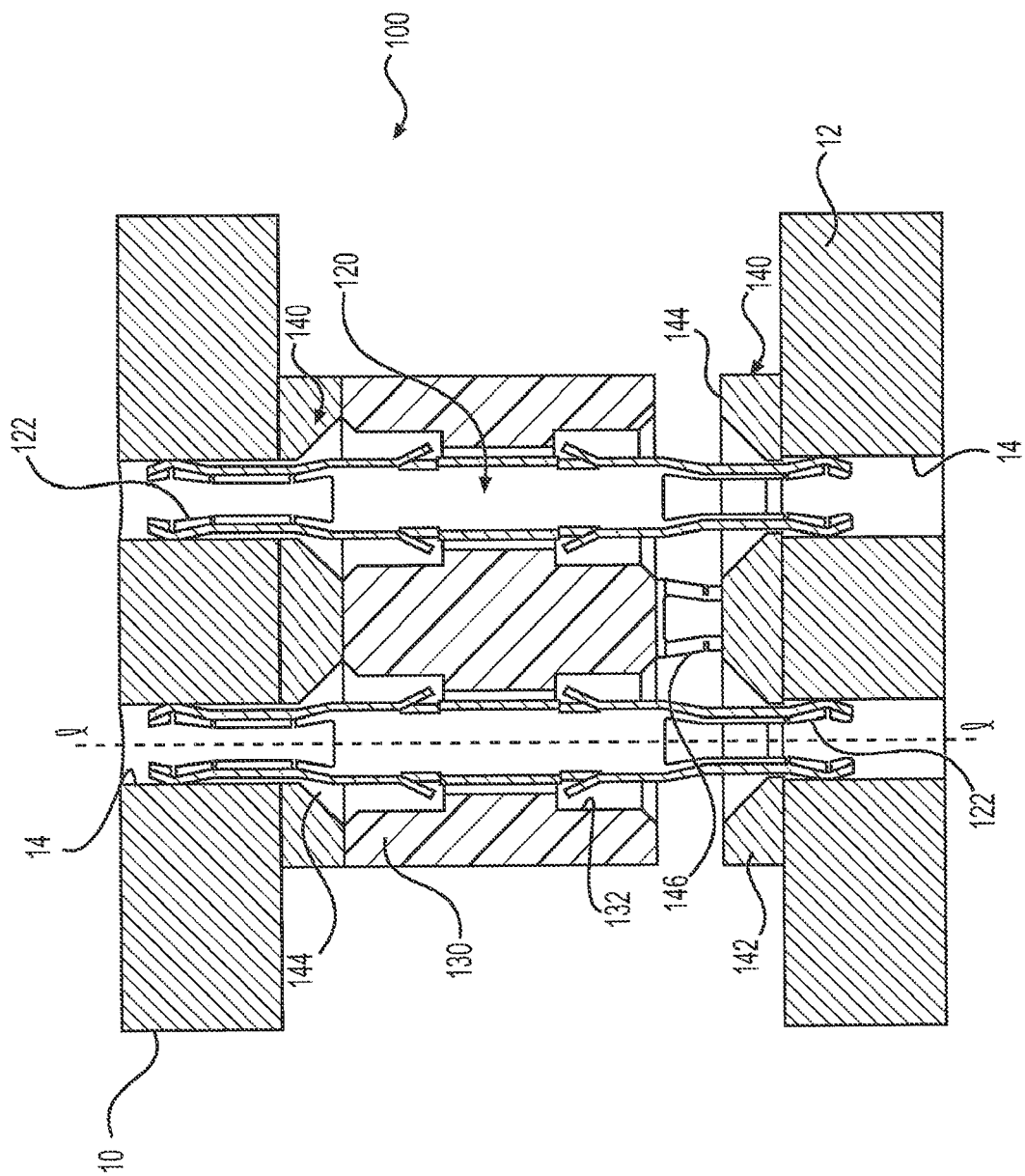
FIG. 5 is a partial elevational view in section of the float connector illustrated in FIG. 1, showing the float connector interconnecting two printed circuit boards and the axial float therebetween.

As seen in FIGS. 3A and 3B, the holder 130 of the contact assembly 110 includes a number of spaced holes 132 for accepting and holding axially in place the individual contacts 120. The contacts 120 are axially retained in the holder 130 for assembly and handling. Each contact 120 may include an engagement feature, such as one or more outwardly extending ribs 123, that catches on a shoulder 134 inside of the hole 132, as seen in FIG. 5. In one embodiment, the contacts 120 may be arranged in the holes 132 in alternating rows of ground and signal contacts. The holder 130 may be a non-conductive dielectric body 136 with the holes 132 extending through the body 136. Ends 122 of each of the contacts 120 extend outside of the holder body 134 from opposite longitudinal sides thereof, for engaging the mating contacts of one of the printed circuit boards 10 and 12, such as its plated holes 14. As seen in FIG. 3C, the contacts 120 may be pins with the ends 122 thereof preferably being slotted and compliant for resiliently engaging the plated holes 14 of the circuit boards 10 and 12. As such, the interconnect provided by connector 100 may be solderless.

As seen in FIG. 5, the contacts 120 may slide axially within their respective holes 14 in the printed circuit boards 10 and 12, thereby allowing the contact assembly 110 to move axially. That is, the contact assembly 110 may move along an axis generally parallel to the longitudinal axes 1 of the contacts 120. This movement provides axial float to the connector 100 which compensates for axial misalignment between printed circuit boards 10 and 12. One or more biasing members, such as one or more spring arms 148 (FIG. 5) may be positioned between the holder 130 and the guide members 140 to achieve even more axial float. For example, the guide members 140 may be outfitted with the spring arms 148 to force the contact assembly 110 into a fully extended position. The spring arms 148 may be integrated into the guide plate's shape in the same material or be a separate spring from the same or different material assembled into the plate 142.

Figure 6:
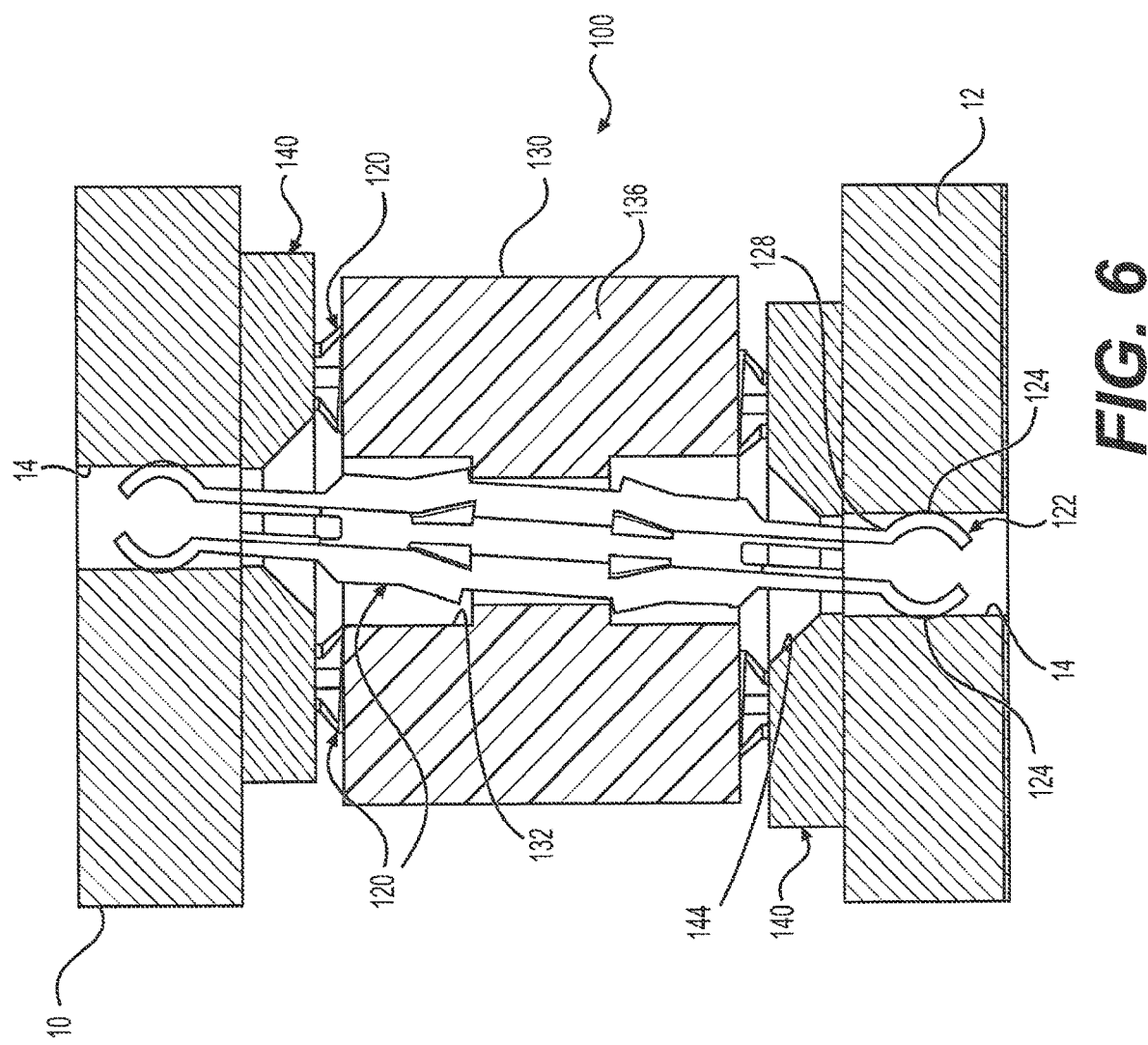
FIG. 6 is a partial elevational view in section of the float connector illustrated in FIG. 1, showing the float connector interconnecting two printed circuit boards and the radial float therebetween.

In addition, the contacts 120 preferably have a clearance fit within the holes 132 of the holder 130, as seen in FIG. 3B. This allows the individual contacts 120 to tilt with respect to the holes 132 to provide radial float and compensate for radial misalignment between the printed circuit boards 10 and 12, as seen in FIG. 6. In one embodiment, the contact ends 122 may have one or more generally rounded contact points 124 and a smaller diameter portion 128 to facilitate the free tilting of the contacts 120 without binding when in respective holes 14.

Each guide plate 142 may also be provisioned with a locking feature to limit the total axial movement of the connector and printed circuit boards and to retain the contact assembly 110 consistently to one side of the mated assembly. In the end application, it is preferable that the connector 100 be retained consistently on one side of the printed circuit board so that the printed circuit board can be replaced with another and maintain the same mating condition.

Figure 7:
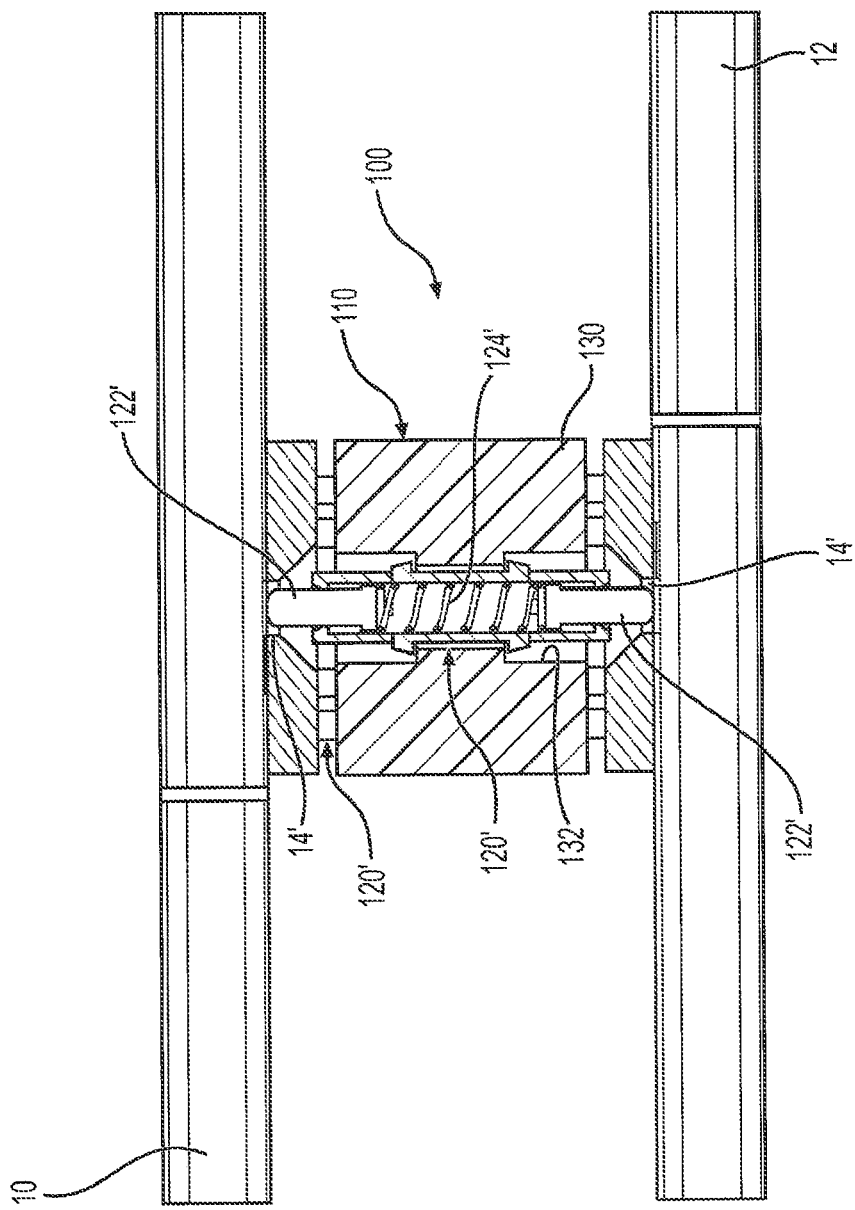
FIG. 7 is partial elevational view in section of the float connector according to an exemplary embodiment of the present invention, showing the float connector with an alternative type of contact.

FIG. 7 illustrates alternative contacts 120' for the connector 100. Instead of being slotted compliant pins, like contacts 120, each contacts 120' may spring biased pins at the ends 122' thereof. A spring 124' is preferably disposed in the contact between the pin ends 122'. In this case, the spring biased contact ends 122' contact respective surfaces of the printed circuit board 10 or 12 rather than being received in a plated hole of the board. For example, the contact ends '122 may contact a conductive pad or trace 14' on the board's surface. The spring 124', such as a compression spring, provides axial float to the connector 100 by allowing the contact assembly 110 to move axially along an axis generally parallel to the longitudinal axis of the contacts 120'. And like contacts 120, the contacts 120' are received in the holes 132 of the holder 130 with clearance to allow for tilting of the contacts 120' to provide radial float to the connector 100.

FIGS. 8A-8D illustrate a second exemplary embodiment of a float connector 200 of the present invention. Float connector 200 is similar to connector 100 of the first embodiment in that it generally includes a contact assembly 210 comprising a matrix of a plurality of contacts 220 supported by a dielectric holder 230 in a manner that allows radial tilt of the contacts 220, where the contact assembly 210 is axially moveable between dielectric guide members 240 associated with each of the printed circuit boards 10 and 12 to interconnect the same.

Figure 8A:
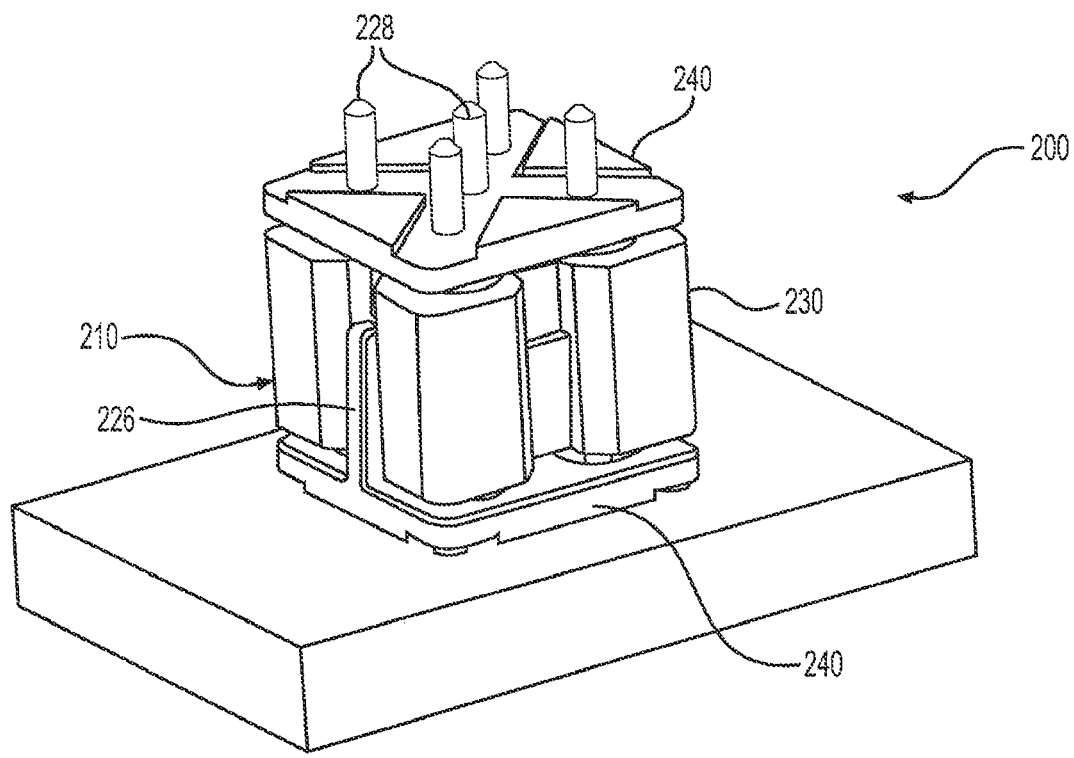
FIGS. 8A thru 8D are various views of a float connector according to a second embodiment of the present invention.
Figure 8B:
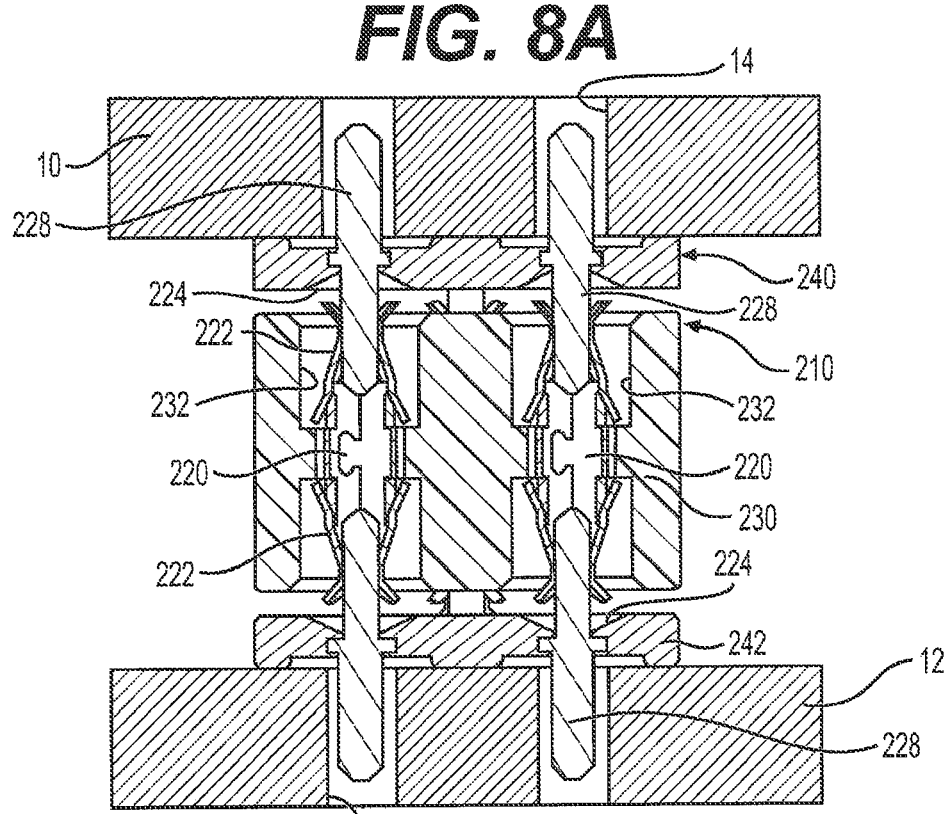
Figure 8C:
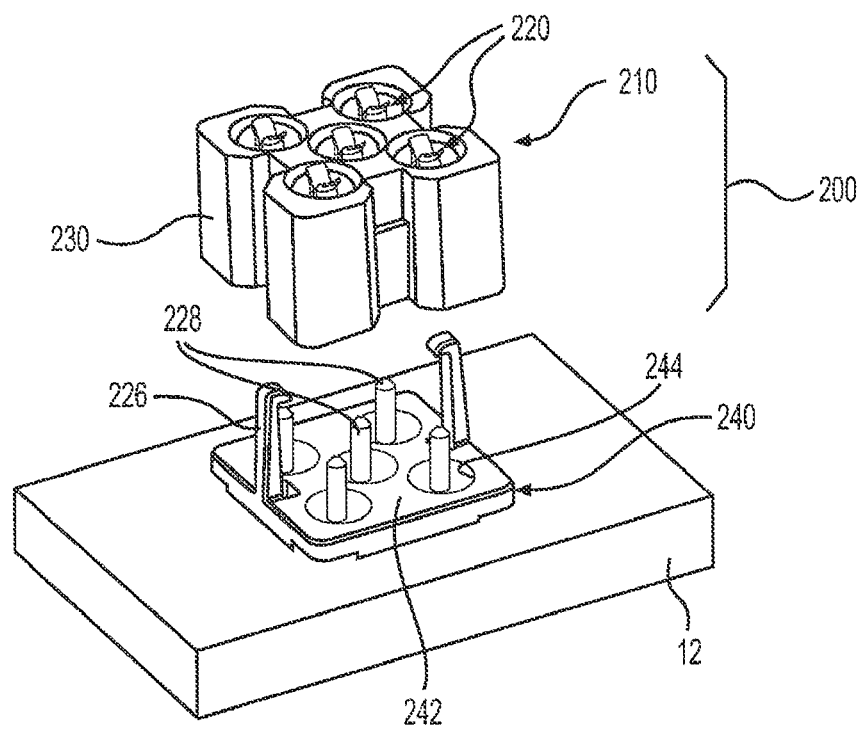
Figure 8D:
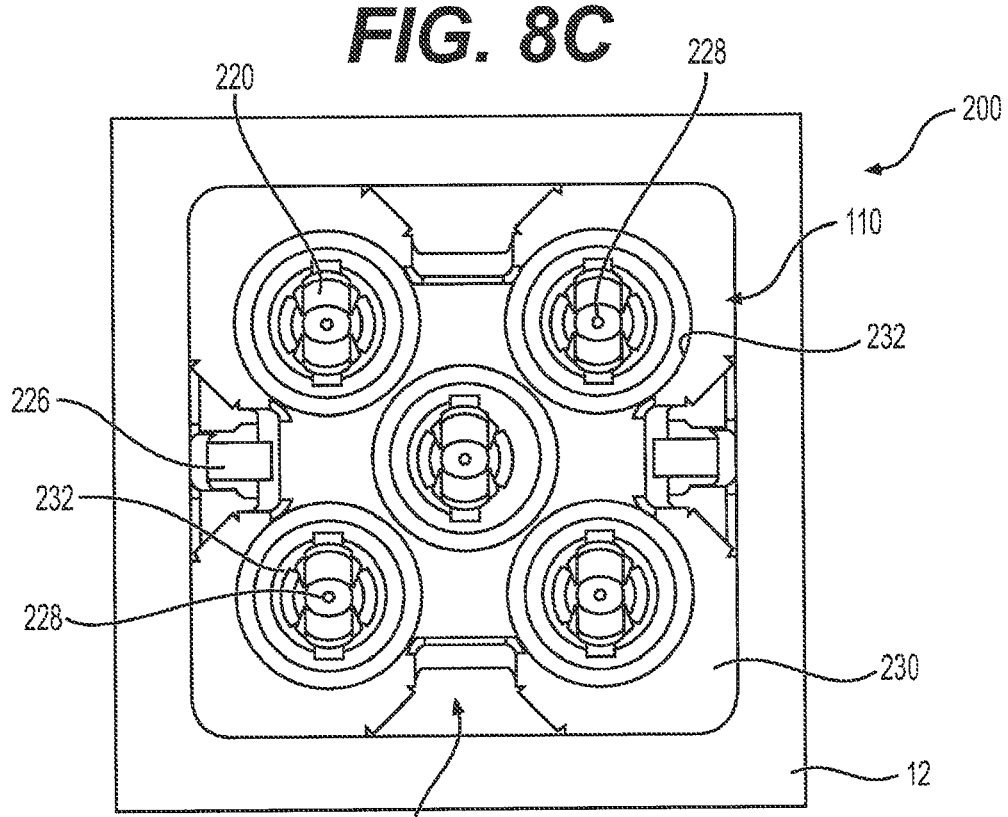

The interconnect provided by connector 200 includes mating contacts 228, such as pin contacts, each being fitted at one end in one of the holes 14 of the printed circuit boards 10 and 12 and that are connectable with the contacts 220 of the contact assembly 210 at the other opposite end, as seen in FIG. 8B. In one embodiment, the mating contacts 228 may be soldered as through hole or as surface mount on the printed circuit boards. The mating contacts 228 may be aligned and positioned with respective guide members 240 such that each contact 228 extends through an opening 244 in a plate 242 of each guide member 240, as seen in FIG. 8A, for mechanical positioning of the mating contacts 228 with respect to the contacts 220 of the contact assembly 210. Contacts 220 preferably include socket ends 222 that extend outside of the holes 232 of the holder 230 for accepting an individual mating contact 228.

The contacts 220 are axially retained in the holder 230 for assembly and handling and allow axial movement with respect to the mating contacts 228. To achieve more axial float, each plate 242 may be outfitted with a biasing member, such as spring arm similar to the first embodiment, to force the holder 230 in a fully extended position. Like in the first embodiment, the contacts 220 preferably have a clearance fit within the respective holes 232 of the holder 230 to allow them to tilt to compensate for radial misalignment between printed circuit boards 10 and 12. The holder 230 may also be provisioned with a locking feature, such as a snap arm 226 (FIG. 8C), to limit the total axial movement of the contact assembly 210 and to retain the holder 230 consistently to one side of the mated assembly.

Figure 9A:
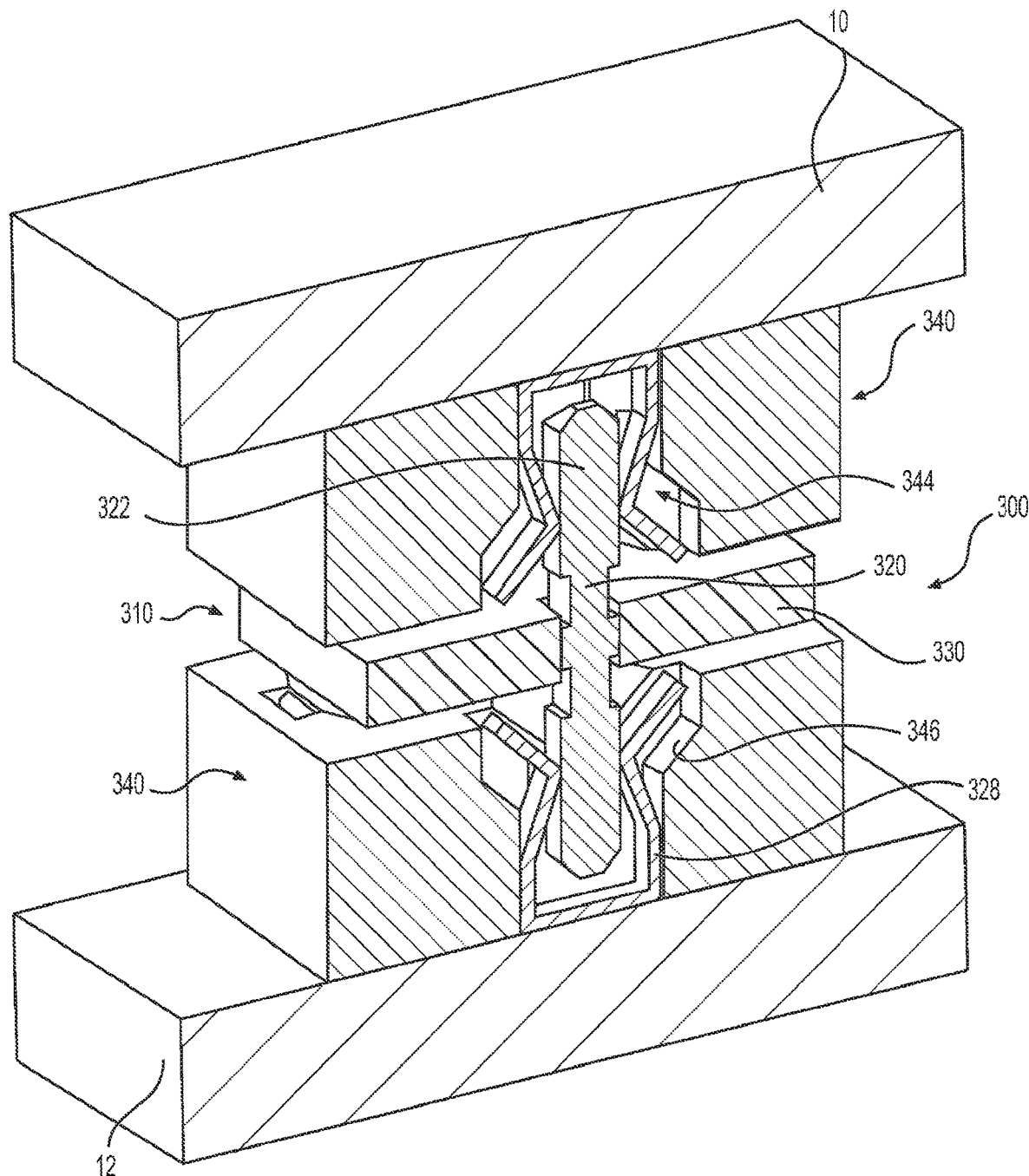
FIGS. 9A thru 9C are various views of a float connector according to a third embodiment of the present invention.
Figure 9B:
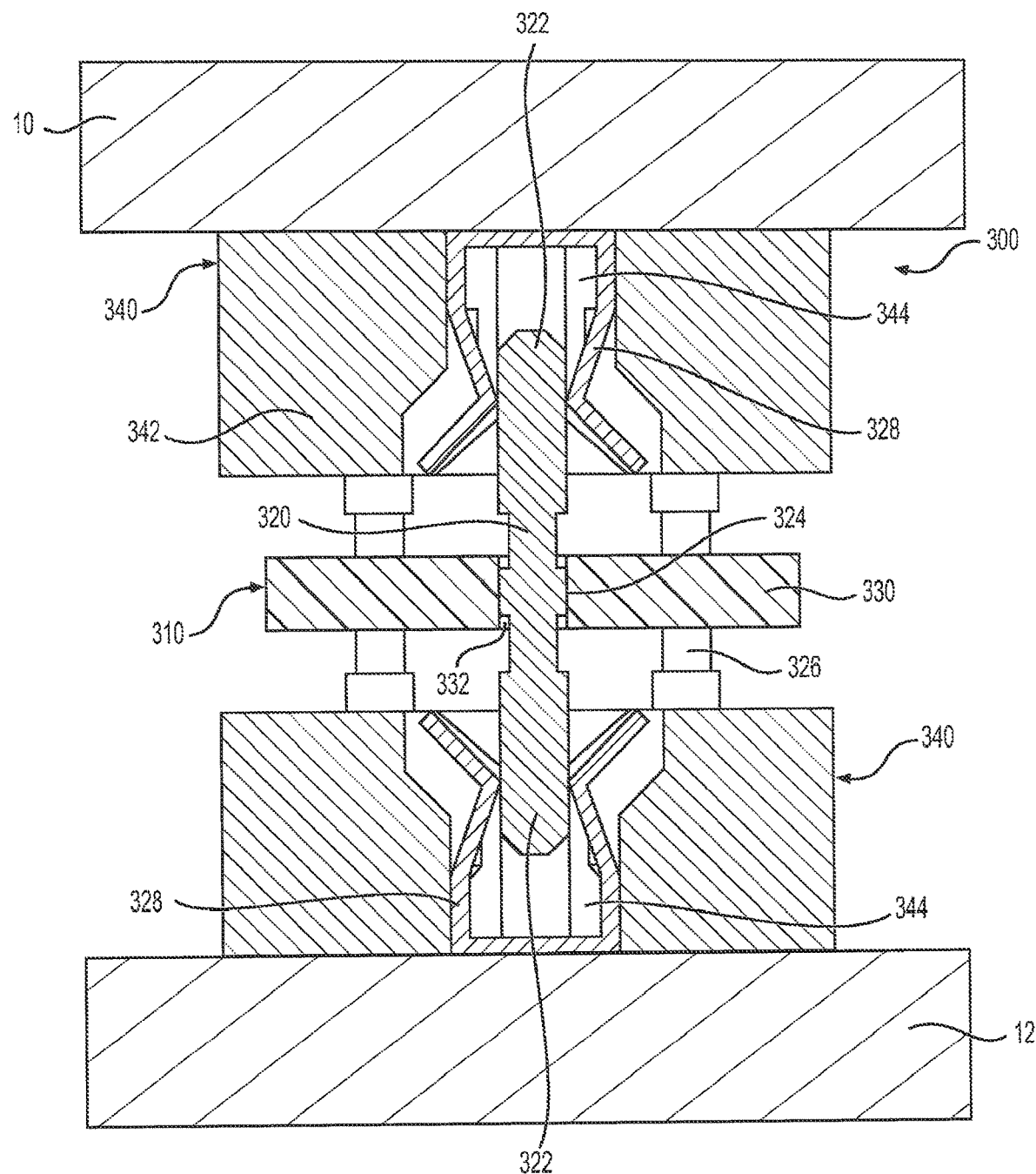
Figure 9C:
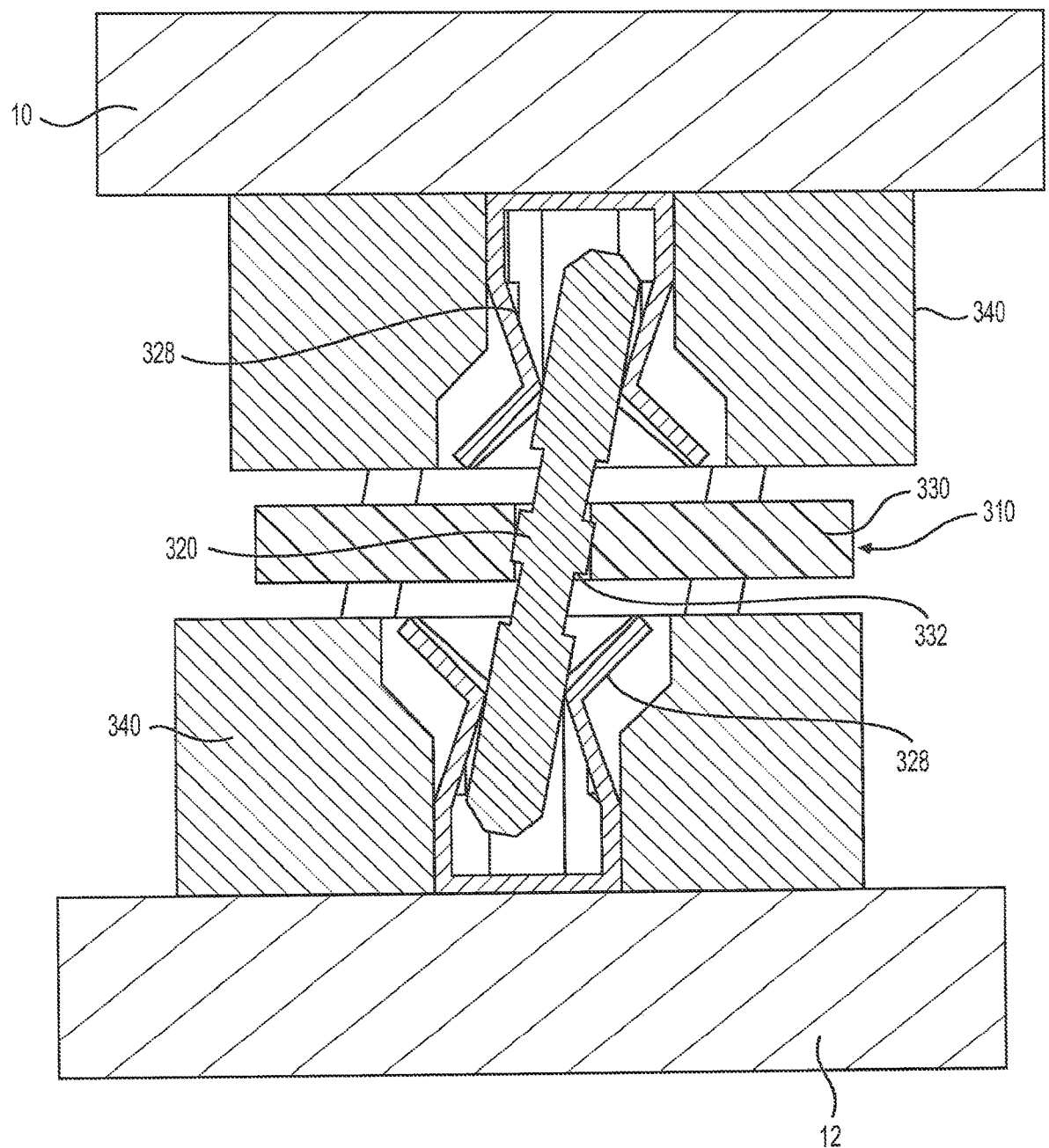

FIGS. 9A-9C illustrate a float connector 300 according to a third exemplary embodiment of the present invention. Like the first and second embodiments, float connector 300 generally includes a contact assembly 310 comprising a matrix of a plurality of tiltable contacts 320 supported by a dielectric holder 330, where the contact assembly 310 is axially moveable between dielectric guide members 340 associated with each of the printed circuit boards 10 and 12 to interconnect the same.

Similar to the second embodiment, the interconnect provided by connector 300 includes mating contacts 328 fitted, such as by solder, to the printed circuit boards 10 and 12 and which connect with the contacts 320 of the contact assembly 310. The mating contacts 328 are preferably sockets (instead of pins like in the second embodiment) and the contacts 320 are preferably pins (instead of sockets like in the second embodiment). The mating contacts 328 are individually received in spaced openings 344 in each the guide members 340 and positioned to accept an individual pin end 322 of the contacts 320. Each opening 344 may have a lead-in geometry 346, like the above embodiments, to guide the ends 322 of the contacts 320 of the contact assembly 310 into the mating contacts 328, even if the contacts 320 are out of direct alignment with the openings 344.

The contacts 320 are axially retained in the holder 330 of the contact assembly 310. Each contact 320 may have an engagement feature, such as raised bumps 324 that snap into the holes 332 of the holder 330. These bumps can be, for example, formed during a stamping process or machined.

Because the pin ends 322 of the contacts may slide axially with respect to the mating contacts 328, the contact assembly 310 is able to move axially, thereby providing axial float. To achieve more axial float, one or more biasing members, such as springs 326 arm may be located between each guide member 340 and the holder 330. The contacts 320 are preferably held in place by the holder 330 with some clearance in the holes 332 of the holder 330 to allow the contacts 320 to tilt, as seen in FIG. 9C to provide radial float to the interconnect between the boards 10 and 12, like the above embodiments. The guide plates 342 may also include a locking feature, similar to the above embodiments, to limit the total axial movement and to retain the contact assembly 310 consistently to one side of the mated assembly.

Figure 10A:
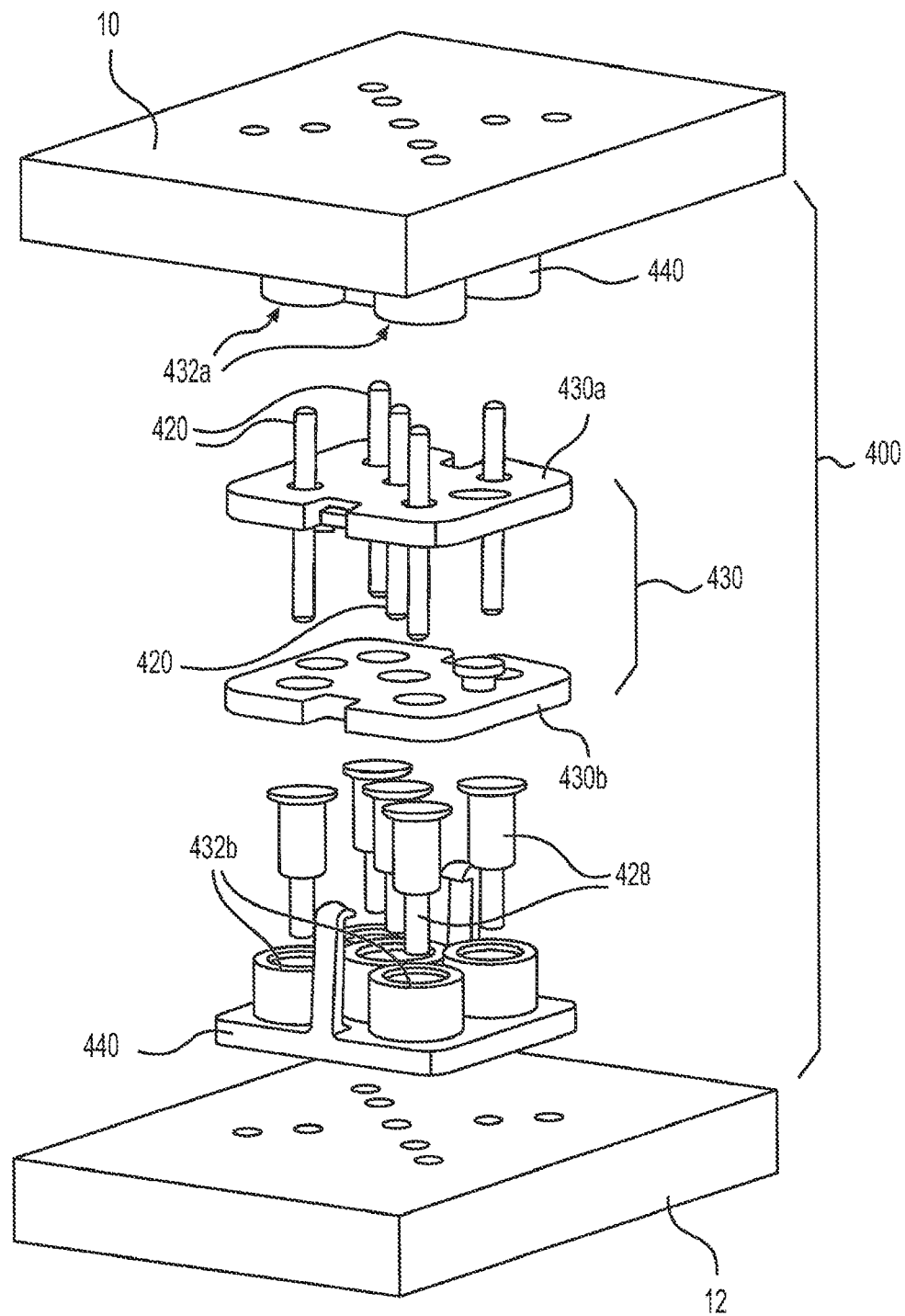
FIGS. 10A thru 10C are various views of a float connector according to a fourth embodiment of the present invention.
Figure 10B:
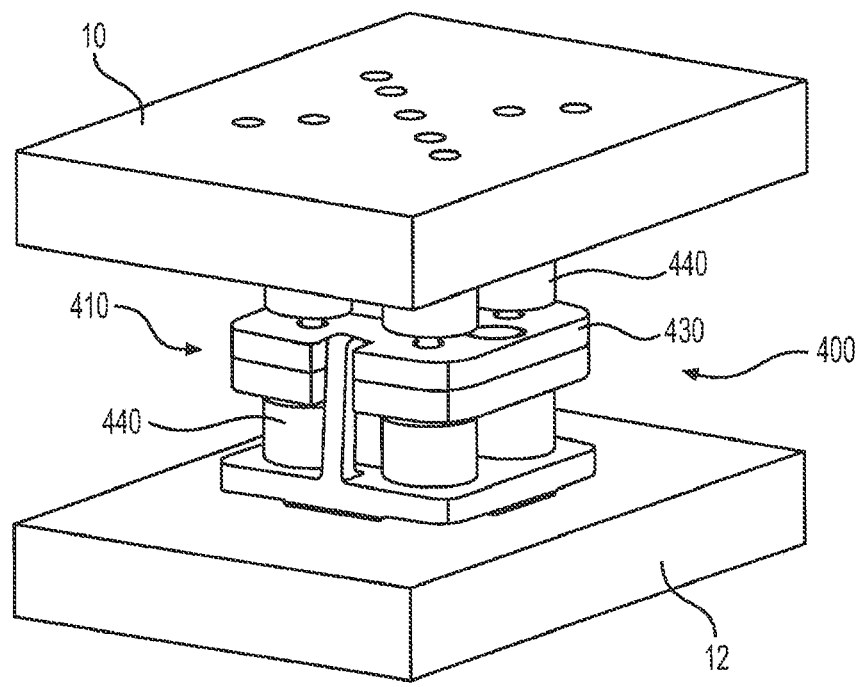
Figure 10C:
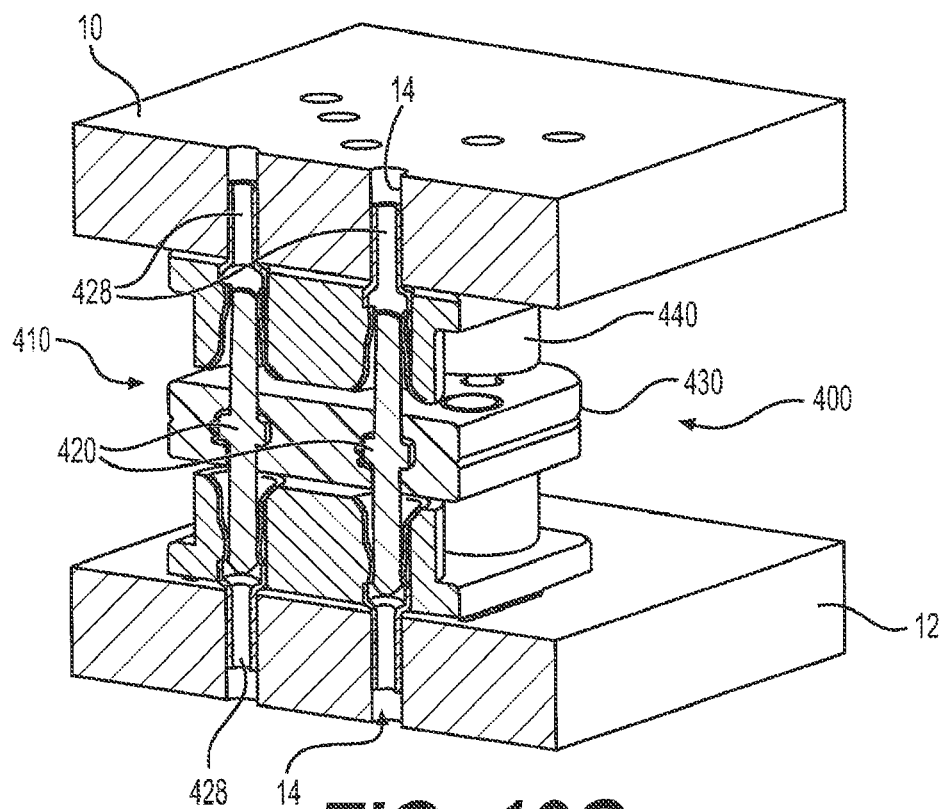

FIGS. 10A-10C illustrate a float connector 400 according to a fourth exemplary embodiment of the present invention. Connector 400 is substantially the same as the connector 300 of the third embodiment, except the configuration thereof is optimized for machining. Like the above embodiments, connector 400 generally includes an axially moveable contact assembly 410 comprising a matrix of a plurality of tiltable contacts 420 supported by a dielectric holder 430, and dielectric guide members 440 associated with each of the printed circuit boards 10 and 12.

Holder 430 is preferably two pieces 430a and 430b with corresponding openings 432a and 432b for individually retaining the contacts 420. The two pieces 430a and 430b may be connected to one another, such as by a snap engagement or the like. The mating contacts 428 are preferably sockets that are round and have tines that face away from the mating direction to reduce mating forces and eliminate potential stubbing between the contacts 420 and the mating contacts 428.

To achieve proper impedance between the signal and ground, it is preferable that the float connector of the present invention have at least one signal and one ground contact. Adding more ground contacts to the above embodiments can improve impedance consistency and shielding to prevent RF from leaking (crosstalk) between closely placed signal lines. Any of the above may also include a ground shield to further improve isolation and reduce crosstalk between RF lines.

While particular embodiments have been chosen to illustrate the invention, it will be understood by those skilled in the art that various changes and modifications can be made therein without departing from the scope of the invention as defined in the appended claims. For example, the contact and mating contacts of the above embodiments may be pin and socket or vice versa; any of the above embodiments can have the spring or have no spring for additional axial float; and any of the above embodiments may have a locking feature to limit axial float. Also, the connector of the present invention may have non-traditional geometry comprising a matrix of pin or socket contacts.

What is claimed is:

1. A float connector for interconnecting first and second printed circuit boards, comprising:
    a contact assembly including a plurality of contacts and a holder configured to axially support the contacts such that opposite first and second ends of each contact are exposed outside of the holder, and the holder supporting each contact in a clearance fit inside thereof, thereby allowing each contact to radially tilt with respect to the holder to compensate for radial misalignment between the first and second printed circuit boards;
    a first guide member separate from the contact assembly such that no portion of the first guide member is received in the holder, and supported by the first printed circuit board, the first guide member having a plurality of first guide features corresponding to each of the first ends of the contacts, respectively, the first guide features being configured to align the first ends of the contacts for electrical connection with the first printed circuit board;
    a second guide member separate from the contact assembly such that no portion of the second guide member is received in the holder, and supported by the second printed circuit board, the second guide member having a plurality of second guide features corresponding to each of the second ends of the contacts, respectively, the second guide features being configured to align the second ends of the contacts for electrical connection with the second printed circuit board; and
    a plurality of mating contacts coupled with the first and second printed circuit boards, each mating contact connecting with one of the plurality of contacts to provide the electrical connection between the first and second printed circuit boards, and the mating contacts being one of plated holes in the first and second printed circuit boards, pins soldered to the first and second printed circuit boards, or sockets connected to the first and second printed circuit boards,
    wherein the contact assembly and each of the first and second guide members are axially movable with respect to one another along an axis generally parallel to longitudinal axes of the contacts to compensate for axial misalignment between the first and second printed circuit boards.

2. The float connector of claim 1, wherein the first and second ends of the plurality of contacts are pins that are slidably received in one of the mating contacts that is received in a respective hole of the first and second printed circuit boards, respectively, to provide the axial float and electrical connection with the first and second printed circuit boards.

3. The float connector of claim 1, wherein the first and second ends of the plurality of contacts are spring biased pins that are axially moveable to provide the axial float.

4. The float connector of claim 1, wherein the first and second ends of the plurality of contacts are sockets, each socket engages one of the mating contacts connected to one of the first and second printed circuit boards.

5. A radial frequency float connector for interconnecting first and second printed circuit boards, comprising:
  a contact assembly including a plurality of contacts and a holder configured to axially support the contacts such that opposite first and second ends of each contact are exposed outside of the holder, the plurality of contacts comprising signal and ground contacts;
  a first guide member separate from the contact assembly such that no portion of the first guide member is received in the holder, and supported by the first printed circuit board, the first guide member having a plurality of first guide features corresponding to each of the first ends of the contacts, respectively, the first guide features being configured to align the first ends of the contacts for electrical connection with the first printed circuit board;
  a second guide member separate from the contact assembly such that no portion of the second guide member is received in the holder, and supported by the second printed circuit board, the second guide member having a plurality of second guide features corresponding to each of the second ends of the contacts, respectively, the second guide features being configured to align the second ends of the contacts for electrical connection with the second printed circuit board;
  means for providing axial float of the contact assembly and each of the first and second guide members with respect to one another to compensate for axial misalignment between the first and second printed circuit boards; and
  means for providing radial float of the contact assembly between the first and second guide members to compensate for radial misalignment between the first and second printed circuit boards.

6. The float connector of claim 5, further comprising means for biasing the contact assembly with respect to one of the first and second guide members.

7. The float connector of claim 5, wherein the plurality of contacts are electrically connected to the first and second printed circuit boards, respectively, without a solder connection there between.

8. A float connector for interconnecting printed circuit boards,
  comprising:
  a contact assembly including at least one contact and a holder configured to axially support the at least one contact in a hole thereof such that opposite first and second pin ends of the at least one contact are exposed outside of the holder, the at least one contact having two outwardly extending ribs spaced from one another and the holder having an inner shoulder positioned between the two outwardly extending ribs, and the holder supporting the at least one contact in a clearance fit inside thereof, thereby allowing the at least one contact to radially tilt with respect to the holder;
  at least one guide member separate from the contact assembly such that no portion of the at least one guide member is received in the holder, and configured to engage a printed circuit board, the at least one guide member having at least one guide feature corresponding to the first pin end of the at least one contact, the at least one guide feature being configured to align the first pin end of the at least one contact for electrical connection with the printed circuit board;
  wherein the contact assembly and the at least one guide member are axially moveable with respect to one another along an axis generally parallel to a longitudinal axis of the at least one contact.

9. The float connector of claim 8, wherein the holder is non-conductive.

10. The float connector of claim 9, wherein the holder is formed as one-piece.

11. The float connector of claim 8, wherein the at least one contact is formed as one-piece.

12. The float connector of claim 8, wherein each of the first and second ends of the at least one contact are slotted and compliant.

13. The float connector of claim 8, wherein the at least one guide member comprises a plate and the at least one guide feature is an opening in the plate, and the opening has a lead-in geometry for aligning the first pin end of the at least one contact.

14. The float connector of claim 8, wherein the first and second pin ends of the at least one contact are spring biased.

15. The float connector of claim 8, wherein a biasing member is located directly between the holder and the at least one guide member.

* * * * *